United States Patent [19]

Sumi

[11] Patent Number: 4,710,898
[45] Date of Patent: Dec. 1, 1987

[54] APPARATUS FOR PERFORMING DESIRED LOGICAL FUNCTION

[75] Inventor: Masahiko Sumi, Chigasaki, Japan

[73] Assignee: Kabushiki Kaisha Toshiba, Kawasaki, Japan

[21] Appl. No.: 716,388

[22] Filed: Mar. 27, 1985

[30] Foreign Application Priority Data

Mar. 28, 1984 [JP] Japan .................................... 59-59882

[51] Int. Cl.$^4$ ............................................. G11C 13/00
[52] U.S. Cl. ...................................... 365/189; 365/230
[58] Field of Search ................. 365/189, 230, 194, 195

[56] References Cited

U.S. PATENT DOCUMENTS 3,541,543  11/1970  Crawford et al.
4,590,588   5/1986  Itoh et al. ............................. 365/189

Primary Examiner—Terrell W. Fears
Attorney, Agent, or Firm—Schwartz, Jeffery, Schwaab, Mack, Blumenthal & Evans

[57] ABSTRACT

An apparatus for performing a desired logical function comprises a logic circuit including signal lines, a storage device storing information which determines whether each of the signal lines is to be sensitized or desensitized, and a device for selectively sensitizing or desensitizing the signal lines on the basis of the information stored in the storage device. The apparatus can be repeatedly and easily programmed by altering information stored in the storage device. Moreover, it can be formed as a highly integrated circuit.

15 Claims, 12 Drawing Figures

| Y | F/F 31 | F/F 32 | F/F 33 | F/F 34 | F/F 35 |
|---|---|---|---|---|---|
| A | 0 | 1 | 1 | 1 | 1 |
| A · B | 0 | 1 | 1 | 1 | 0 |
| A + B | 1 | 1 | 0 | 1 | 1 |
| A ⊕ B | 1 | 1 | 0 | 0 | 1 |
| $\overline{A \oplus B}$ | 1 | 0 | 1 | 1 | 0 |

APPARATUS FOR PERFORMING DESIRED LOGICAL FUNCTION

BACKGROUND OF THE INVENTION

The present invention relates to an apparatus for performing a desired logical function.

A gate array and a PLA (Programmable Logic Array) are well known as a device for performing a desired logical function. The gate array is a device which becomes a logic circuit performing a desired logic function by changing a metalization pattern formed on a master substrate having unit elements. The PLA is a logic array which is programmable to provide a desired logic function. There are two types of the PLA a mask PLA and an FPLA (Field-PLA). The mask PLA is a PLA which is programmed by a manufacurer. The FPLA is a PLA which can be programmed by a user.

In order to produce the gate array and mask PLA of a different logic function, it is necessary to use at least one different mask pattern whereas most of mask patterns are common. Although the gate array and mask PLA are more suitable for small scale production than a custom order IC, they are not suitable for very small scale production, such as a few devices. This is because producing a new mask pattern is costly.

The FPLAs are differently programmable from each other by a user to perform a different logical function. Programming may be performed by passing large enough current through fuses at intersections to melt them, or by passing large enough current through diodes at intersections to destroy them. As mentioned above, programming requires flowing large current which produces much heat in the FPLA. This results in the problem that it is difficult to improve integration. Another problem is that the FPLA after programming can be used for only one purpose. This is because a logical function generated by programming cannot be changed to another logical function.

SUMMARY OF THE INVENTION

An object of the present invention is to provide a method and an apparatus for performing a desired logical function which can be repeatedly programmed and can be highly integrated.

To achieve this object, the present invention provides a method of determining logical function comprising the steps of storing, in one or more storage means, information determining whether each of signal lines in a logic circuit is to be sensitized or desensitized, and selectively sensitizing or desensitizing the signal lines on the basis of the information stored in the storage means, thereby to change a logical function of the logic circuit.

To achieve this object, the present invention provides an apparatus for performing a desired logical function comprising: a logic circuit including signal lines; storage means storing information which determines whether each of the signal lines is to be sensitized or desensitized; and means for selectively sensitizing or desensitizing the signal lines on the basis of the information stored in the storage means.

DETAILED DESCRIPTION OF THE INVENTION

Figures 1, 2:
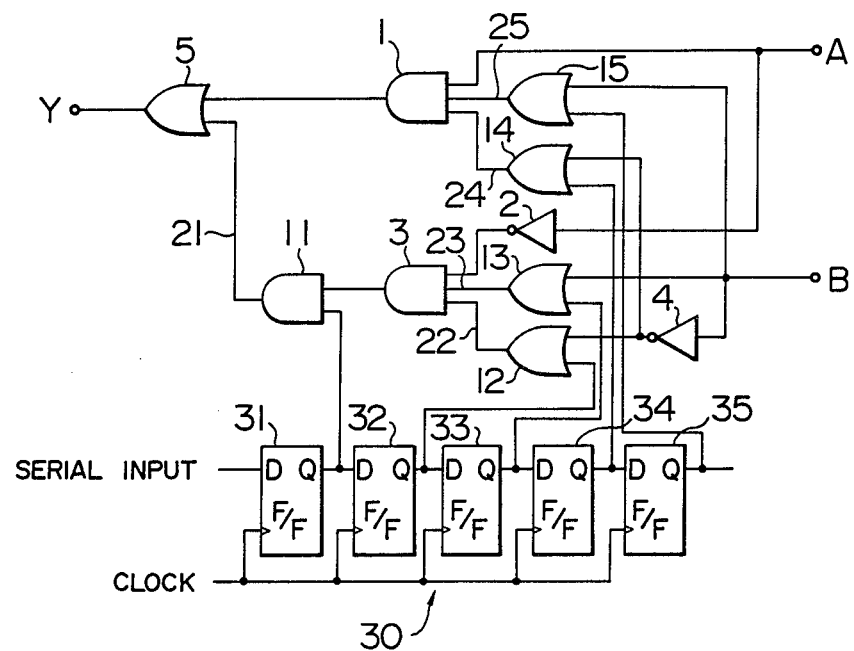
FIG. 1 is a circuit diagram showing an apparatus according to a first embodiment of the present invention.
FIG. 2 is a truth table for an output logical function generated by the apparatus.

FIG. 1 shows an apparatus according to a first embodiment of the present invention. The apparatus produces an output logical signal Y representing a logical function of two input logical signals A and B. The logical signal A is inputted to an AND gate 1 and an inverter 2. An inverted signal $\overline{A}$ from the inverter 2 is inputted to an AND gate 3. The logical signal B is inputted to the AND gate 1 through an OR gate 15 and to the AND gate 3 through an OR gate 13. An inverted signal $\overline{B}$ from an inverter 4 is inputted to the AND gate 1 through an OR gate 14 and to the AND gate 3 through an OR gate 12. An output signal of the AND gate 1 is inputted to an OR gate 5. An output signal of the AND gate 3 is inputted to the OR gate 5 through an AND gate 11. The OR gate 5 generates the output signal Y.

Outputs Q of flip-flops 31, 32, 33, 34, and 35 are connected to the AND gate 11, OR gates 12, 13, 14, and 15, respectively. Signal lines 21, 22, 23, 24, and 25 are selectively sensitized or desensitized according to the information stored in the flip-flops 31, 32, 33, 34, and 35, respectively. In this specification, to "sensitize" a signal line means to put the signal line in a condition where an input signal inputted thereto can be transmitted, and to "desensitize" an signal line means to put the signal line in a condition where an input signal inputted thereto cannot be transmitted.

The AND gate 11 selectively sensitizes or desensitizes the signal line 21 according to the information stored in the flip-flop 31. Specifically, when the output Q of the flip-flop 31 is at logic 1, the signal line 21 is sensitized so that the output of the AND gate 3 is transmitted on the signal line 21. On the contrary, when the output Q of the flip-flop 31 is at logic 0, the signal line 21 is desensitized so that the signal line 21 is held at logic 0 regardless of the output of the AND gate 3. The OR gate 12 selectively sensitizes or desensitizes the signal line 22 according to the information stored in the flip-flop 32. Specifically, when the output Q of the flip-flop 32 is at logic 0, the signal line 22 is sensitized so that the inverted signal $\overline{B}$ is transmitted on the signal line 22. On the contrary, when the output Q of the flip-flop 32 is at logic 1, the signal line 22 is desensitized so that the signal line 22 is held at logic 1. Similarly, the OR gates 13, 14, and 15 sensitize the signal lines 23, 24, and 25 when the outputs Q of the flip-flops 33, 34, and 35 are at logic 0, respectively, and desensitize the signal lines 23, 24, and 25 when the outputs are at logic 1.

In the embodiment, the flip-flops 31, 32, 33, 34, and 35 constitute a shift registor 30. The information determining whether the signal lines are to be sensitized or desensitized is applied in serial to the input D of the flip-flop 33. The information will be simultaneously available, i.e., in parallel, at the outputs Q of the flip-flops. FIG. 2 shows what logical function the output signal Y represents according to the information stored in the shift register 30. For instance, the output Y=A because of desensitizing all the signal lines 21, 22, 23, 24, and 25 when the five outputs Q of the flip-flops 31, 32, 33, 34, and 35 are at logic 0, 1, 1, 1, and 1, respectively. The output Y=A·B because of sensitizing only the signal line 25 when the five outputs Q are at logic 0, 1, 1, 1, and 0. The output Y=A+B because of sensitizing the signal lines 21 and 23 when the five outputs Q are at logic 1, 1, 0, 1, and 1. The output Y=A⊕B because of sensitizing the signal lines 21, 23, and 24 when the five outputs Q are at logic 1, 1, 0, 0, and 1. The output Y=$\overline{A \oplus B}$ because of sensitizing the signal lines 21, 22, and 25 when the five outputs Q are at logic 1, 0, 1, 1, and 0. As mentioned above, the logical function of the output Y can be changed according to the information stored in the shift register 30.

Figure 3:
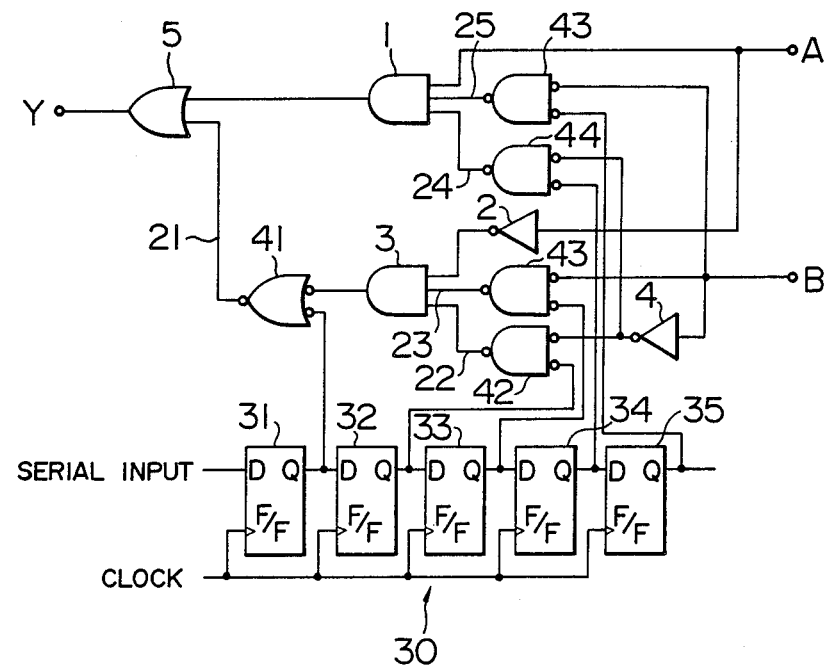
FIG. 3 is a circuit diagram showing an apparatus according to a second embodiment of the present invention.

FIG. 3 shows an apparatus according to a second embodiment. In the second embodiment, a NOR gate 41, NAND gates 42, 43, 44, and 45 are used in substitution for the AND gate 11, OR gates 12, 13, 14, and 15, respectively, in the first embodiment. The NOR gate 41, NAND gates 42, 43, 44, and 45 operate in the same manner as the AND gate 11, OR gates 12, 13, 14, and 15. Therefore, the apparatus according to the second embodiment can perform a desired logical function in the same way as the first embodiment.

Figure 4:
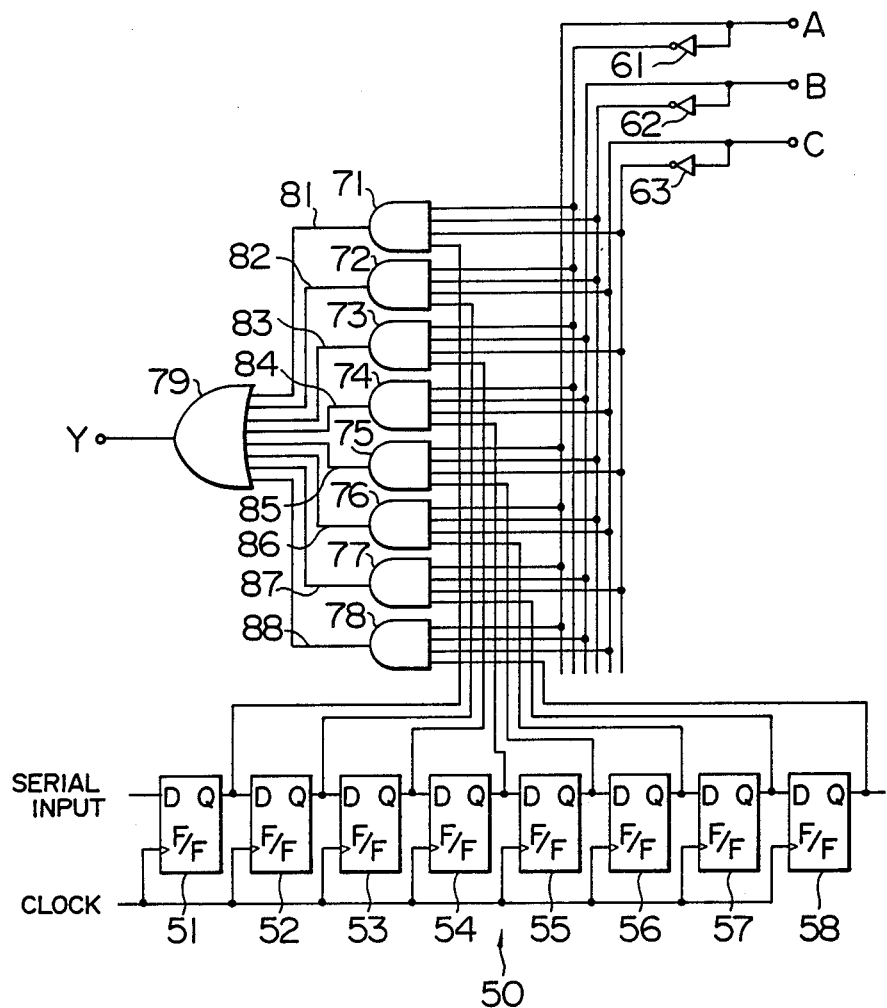
FIG. 4 is a circuit diagram showing an apparatus according to a third embodiment of the present invention.

FIG. 4 shows an apparatus according to a third embodiment of the present invention. The apparatus produces an output logical signal Y representing a desired logical function of three input signals A, B, and C. The input signals A, B, and C are applied to three inverters 61, 62, and 63 to change them to three inverted signals $\overline{A}$, $\overline{B}$, and $\overline{C}$. AND gates 71, 72, . . . , and 78 generate all minterms. The term "minterm" is a product term in which each of the variables A, B, and C (sometimes inverted, sometimes not) appears. To the AND gate 71 are inputted the signals $\overline{A}$, $\overline{B}$, and $\overline{C}$; to the AND gate 72, the signals $\overline{A}$, $\overline{B}$, and C; to the AND gate 73, the signals $\overline{A}$, B, and $\overline{C}$; to the AND gate 74, the signals $\overline{A}$, B, and C; to the AND gate 75, the signals A, $\overline{B}$, and $\overline{C}$; to the AND gate 76, the signals A, $\overline{B}$, and C; to the AND gate 77, the signals A, B, and $\overline{C}$; to the AND gate 78, the signals A, B, and C. All the outputs of the AND gates 71, 72, . . . and 78 are connected to inputs of an OR gate 79 which generates the output signal Y.

Flip-flops 51, 52, . . . , and 58 constitute a shift register 50. The flip-flops 51, 52, . . . , and 58 store information determining whether each of signal lines 81, 82, . . . , and 88 is to be sensitized or desensitized. Outputs Q of the flip-flops 51, 52, . . . , and 58 are connected to input terminals of the AND gates 71, 72, . . . , and 78. For instance, when the output Q of the flip-flop 51 is at logic 1, the signal line 81 is sensitized so that a product signal $\overline{A}$ $\overline{B}$ $\overline{C}$ is transmitted onto the signal line 81. On the contrary, when the output Q of the flip-flop 51 is at logic 0, the signal line 81 is desensitized to be held at logic 0.

The output function Y is in the standard sum-of-products form, or a sum of minterms form. When the outputs Q of all the flip-flops 51, 52, . . . , and 58 are at logic 1, the output function Y is as follows:

$$Y=\overline{A}\,\overline{B}\,\overline{C}+\overline{A}\,\overline{B}\,C+\overline{A}\,B\,\overline{C}+\overline{A}\,B\,C+A\,\overline{B}\,\overline{C}+A\,\overline{B}\,C+A\,B\,\overline{C}+A\,B\,C$$

Therefore, the apparatus can generate as an output function Y a desired logical function of three variables A, B, and C. For instance, when the outputs Q of the flip-flops 52, 54, 57, and 58 are at logic 1 and the outputs of the flip-flops 51, 53, 55, and 56 are at logic 0, only the signal lines 82, 84, 87, and 88 are sensitized so that the output function Y is as follows:

$$Y = \overline{A}\overline{B}C + \overline{A}BC + AB\overline{C} + ABC$$
$$= \overline{A}C(B + \overline{B}) + AB(\overline{C} + C)$$
$$= \overline{A}C + AB$$

Figure 5:
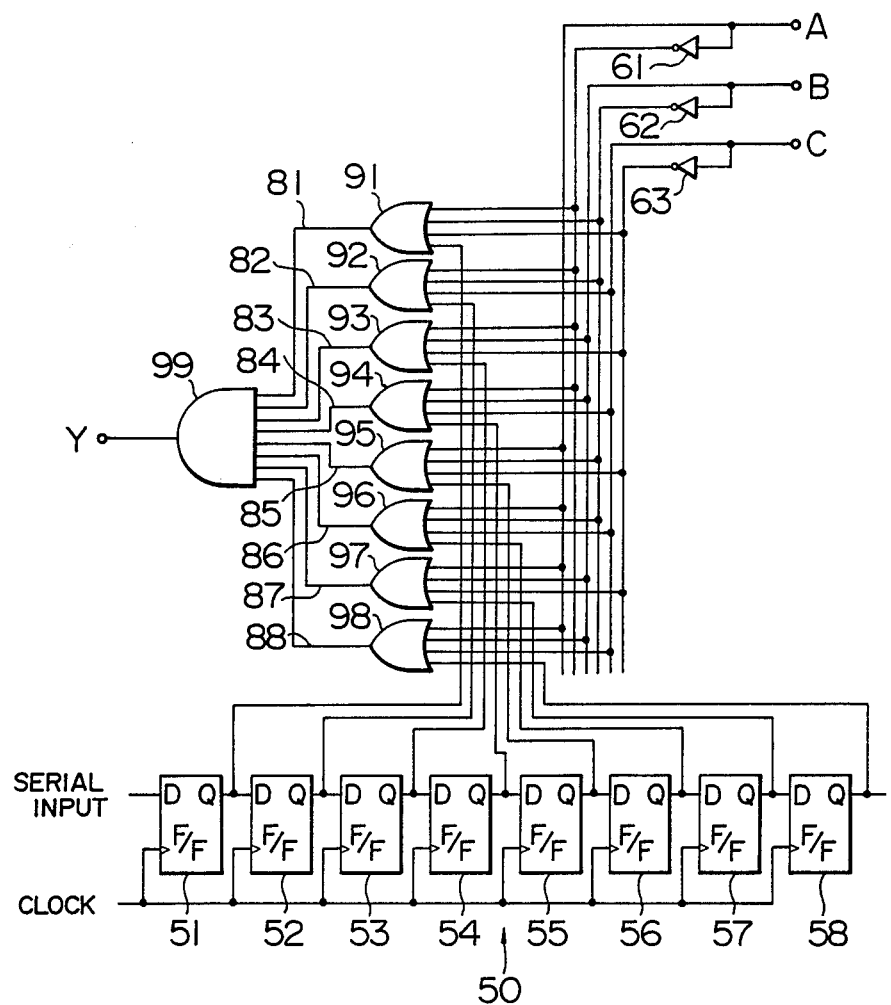
FIG. 5 is a circuit diagram showing an apparatus according to a fourth embodiment of the present invention.

FIG. 5 shows an apparatus according to a fourth embodiment of the present invention. In this embodiment, OR gates 91, 92, . . . , and 98 are used in substitution for the AND gates 71, 72, . . . , and 78, and an AND gate 99 is used in substitution for the OR gate 79. The AND gates 71, 72, . . . , and 78 generate all maxterms of variables A, B, and C. The term "maxterm" is a sum term in which each of the variables A, B, and C (sometimes inverted, sometimes not) appears. The output function Y is in the standard product-of-sums form. When the outputs Q of all the flip-flops 51, 52, . . . and 58 are at logic 1, the output function Y is as follows:

$$Y=(\overline{A}+\overline{B}+\overline{C})(\overline{A}+\overline{B}+C)(\overline{A}+B+\overline{C})(\overline{A}+B+C) \\ \times(A+\overline{B}+\overline{C})(A+\overline{B}+C)(A+B+\overline{C})(A+B+C)$$

Therefore, the apparatus can generate a desired logical function of three variables A, B, and C. For instance, when the output Q of the flip-flips 54, 55, 56, and 58 are at logic 1 and the outputs Q of the flip-flops 51, 52, 53, and 57 are at logic 0, only the signal lines 81, 82, 83, and 87 are sensitized so that the output function Y is as follows:

$$Y = (\overline{A} + B + C)(A + \overline{B} + \overline{C})(A + \overline{B} + C)(A + B + C)$$
$$= AB + \overline{B}C$$

Instead of the shift register in the first through fourth embodiments, a memory with parallel outputs may be used as a storage means for storing information which determines whether each of the signal lines is to be sensitized or desensitized. For example, a ROM with parallel outputs may be used as a storage means. When various data are stored in the various memory locations of the ROM, a logic function can be changed dynamically, i.e., it can be changed during operation by altering the address information of the ROM.

Figure 6:
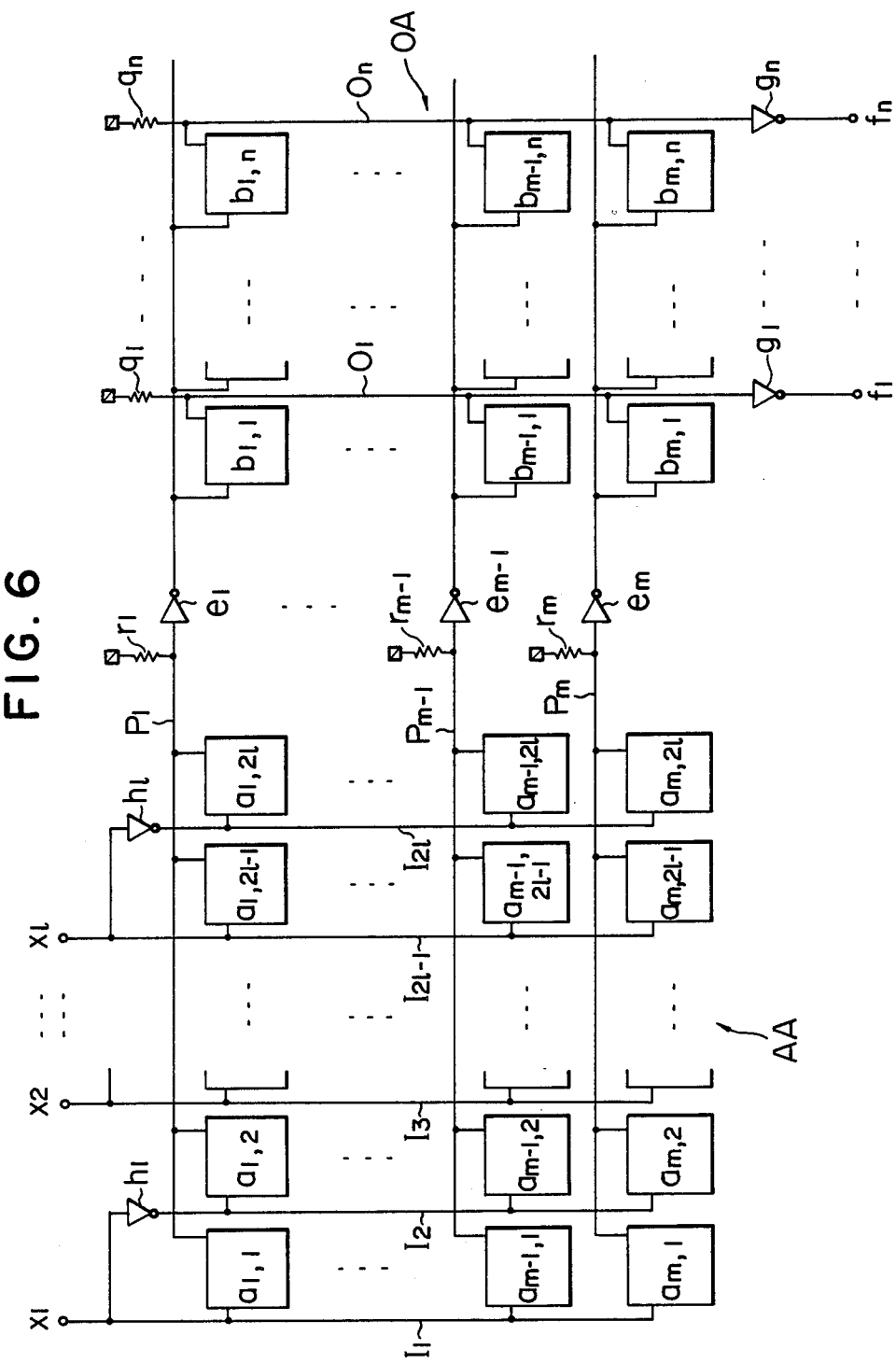
FIG. 6 is a circuit diagram showing an apparatus according to a fifth embodiment of the present invention.
Figure 7:
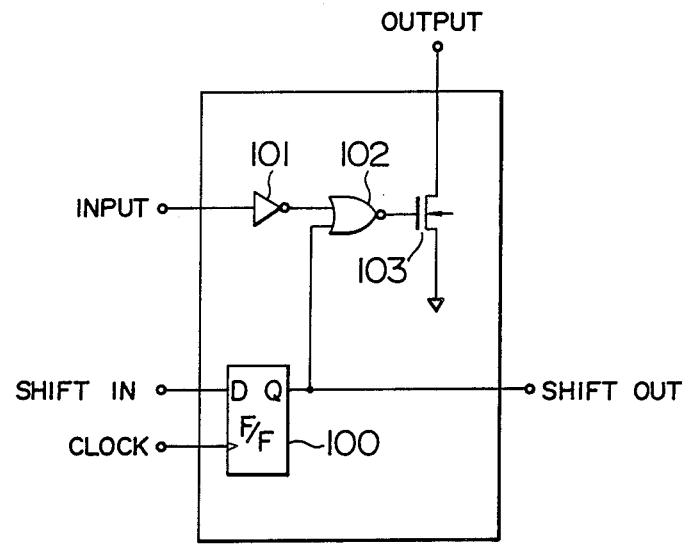
FIG. 7 is a circuit diagram showing a unit circuit used in the apparatus.

FIGS. 6 and 7 show an apparatus according to a fifth embodiment of the present invention. The apparatus has 2 vertical input lines $I_1$, . . . , and $I_{2l}$ over which input singals $x_1, \ldots, x_l$ and inverted signals $\bar{x}_1, \ldots, \bar{x}_l$ are transmitted and m horizontal product term lines $P_1, \ldots, P_m$ which intersect the input lines $I_1, \ldots, I_{2l}$. Unit circuits $a_{1,1}, \ldots, a_{m,2l}$ are positioned at $2l \times m$ in tersections where the input lines $I_1, \ldots, I_{2l}$ and the product term lines $P_1, \ldots, P_m$ intersect. The input lines $I_1, \ldots, I_{2l}$ the product term lines $P_1, \ldots, P_m$, the unit circuits $a_{1,1}, \ldots, a_{m,2l}$, and resisters $r_1, \ldots, r_m$ connected to the product term lines $P_1, \ldots, P_m$ constitute an AND array.

Each of the unit circuit $a_{1,1}, \ldots, a_{m,2l}$ comprises a flip-flop 100, an inverter 101, a NOR gate 102, and an NMOS FET 103, as shown in FIG. 7. A signal line connected to an output terminal of the unit circuit is selectively sensitized or desensitized according to information stored in the flip-flop 100. Specifically, when the output Q of the flip-flop 100 is at logic 1, the NMOS FET 103 is held "on" regardless of an input signal of the unit circuit, i.e., the signal line connected to the output terminal is desensitized. On the contrary, when the output Q of the flip-flop 100 is at logic 0, the NMOS FET 103 is selectively "on" or "off" in response to the input signal, i.e. the signal line is sensitized. In order to set data in the flip-flops by serial transmission of data, all the flip-flops of the unit circuits connected to each of the product term lines $P_1, \ldots, P_m$ may be connected in cascade with each other. Alternatively, all the flip-flops connected to each of the input lines $I_1, \ldots, I_{2l}$ may be connected in cascase. Still alternatively, all the flip-flops of all the unit circuits may be connected in cascade. Although not illustrated as such in FIG. 6, a clock signal is applied to each of the flip-flops.

Simple connections of the output terminals of the unit circuits $a_{1,1}, \ldots, a_{m,2l}$ to the respective product term lines $P_1, \ldots, P_m$ with resisters $r_1, \ldots, r_m$ form wired-NOR connections. The product term lines $P_1, \ldots, P_m$ are connected to inverters $e_1, \ldots, e_m$. Input signals to the input terminals of the unit circuits $a_{1,1}, \ldots, a_{m,2l}$ are inverted so that the inverted signals appear at the output terminals of them, when they sensitize the product term lines. As a result, the wired-NOR connections produce logical products of the input signals $x_1, \ldots, x_l$ and the inverted signals $\bar{x}_1, \ldots, \bar{x}_l$. For instance, when the flip-flops of the unit circuits $a_{1,1}, a_{1,3}$, and $a_{1,2l}$ store information indicating logic 0 and the flip-flops of the other unit circuits $a_{1,2}, a_{1,4}, \ldots, a_{1,2l-1}$ store information indicating logic 1, a signal $p_1$ on the product term line $P_1$ is as follows:

$$p_1 = x_1 + x_2 + \bar{x}_l = \bar{x}_1 \cdot \bar{x}_2 \cdot x_l$$

The AND array can generate desired logical products of the input signals $x_1, \ldots, x_l$ and the inverted signals $\bar{x}_1, \ldots, \bar{x}_l$ on the respective product term lines $P_1, \ldots, P_m$ according to information stored in the flip-flops of the unit circuits $a_{1,1}, \ldots, a_{m,2l}$.

The apparatus has n output lines $O_1, \ldots, O_n$ which intersect the product term lines $P_1, \ldots, P_m$. Unit circuits $b_{1,1}, \ldots, b_{m,n}$ are positioned at $m \times n$ intersections where the product term lines $P_1, \ldots, P_m$ and the output lines $O_1, \ldots, O_n$ intersect. The output lines $O_1, \ldots, O_n$ are connected to a power supply via resisters $q_1, \ldots, q_n$ and to output terminals via inverters $g_1, \ldots, g_n$. An OR array OA is constituted by the inverters $e_1, \ldots, e_m$, the product term lines $P_1, \ldots, P_m$, the output lines $O_1, \ldots, O_n$, the unit circuits $b_{1,1}, \ldots, b_{m,n}$, and the inveters $g_1, \ldots, g_n$.

The unit circuits $b_{1,1}, \ldots, b_{m,n}$ are also shown in FIG. 7. In the same manner as the unit circuits $a_{1,1}, \ldots, a_{m,2l}$, a signal line connected to an output terminal of the unit circuit is sensitized when the output Q of the flip-flop 100 is at logic 0, and the signal line is desensitized when the output Q is at logic 1. Simple connections of the output terminals of the unit circuits $b_{1,1}, \ldots, b_{m,n}$ to the respective output lines $O_1, \ldots, O_n$ with resisters $q_1, \ldots, q_n$ form wired-NOR connections. Therefore, the apparatus generates output logical functions $f_1, \ldots, f_n$ of the output signals $p_1, \ldots, p_n$ of the AND array AA. For instance, when the flip-flops of the unit circuits $b_{1,1}, b_{2,1},$ and $b_{m,1}$ store information indicating logic 0 and the flip-flops of the other unit circuits $b_{3,1}, \ldots,$ and $b_{m-1}$ store information indicating logic 1, a function $f_1$ on the output line $O_1$ is as follows:

$$f_1 = \overline{\overline{p_1} + \overline{p_2} + \overline{p_m}} = \overline{p} + \overline{p_2} + \overline{p_m}$$

The output signals $f_1, \ldots, f_n$ are sums of the logical signals $p_1, \ldots, p_m$ which are products of the input signals $x_1, \ldots, x_1, \bar{x}_1, \ldots, \bar{x}_1$. The OR array can generate desired logical sums of the product signals $p_1, \ldots, p_m$ on the respective output lines $O_1, \ldots, O_n$.

As mentioned above, the apparatus comprising the OR array OA and the AND array AA can generate any desired one of the logical functions $f_1, \ldots, f_n$, which are desired logical sums of desired logical products of the input signals $x_1, \ldots, x_1, \bar{x}_1, \ldots, \bar{x}_1$. This is because every logical function can be represented in the standard sum-of-products form.

Figure 8A:
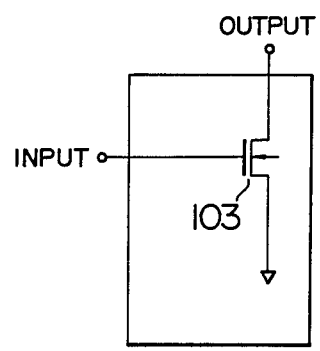
FIGS. 8a and 8b are circuit diagrams showing modifications of the unit circuit, respectively.
Figure 8B:
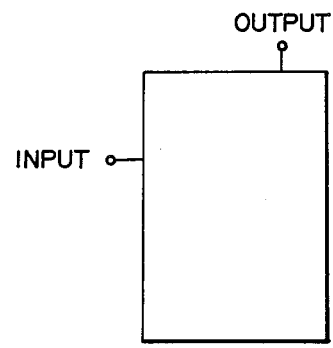

In the embodiment, unit circuits as shown in FIGS. 8a and 8b may be used in substitution for the unit circuit as shown in FIG. 7, where the signal lines connected to the output terminals of the unit circuits are to be kept sensitized or desensitized. Specifically, where the signal line is to be kept sensitized, the unit circuit, as shown in FIG. 8a, comprises an NMOS FET 103, which is selectively "on" or "off" in response to the input signal. Where the signal line is to be kept desensitized, by the unit circuit the input terminal and the output terminal are not connected to each other as shown in FIG. 8b.

Figure 9:
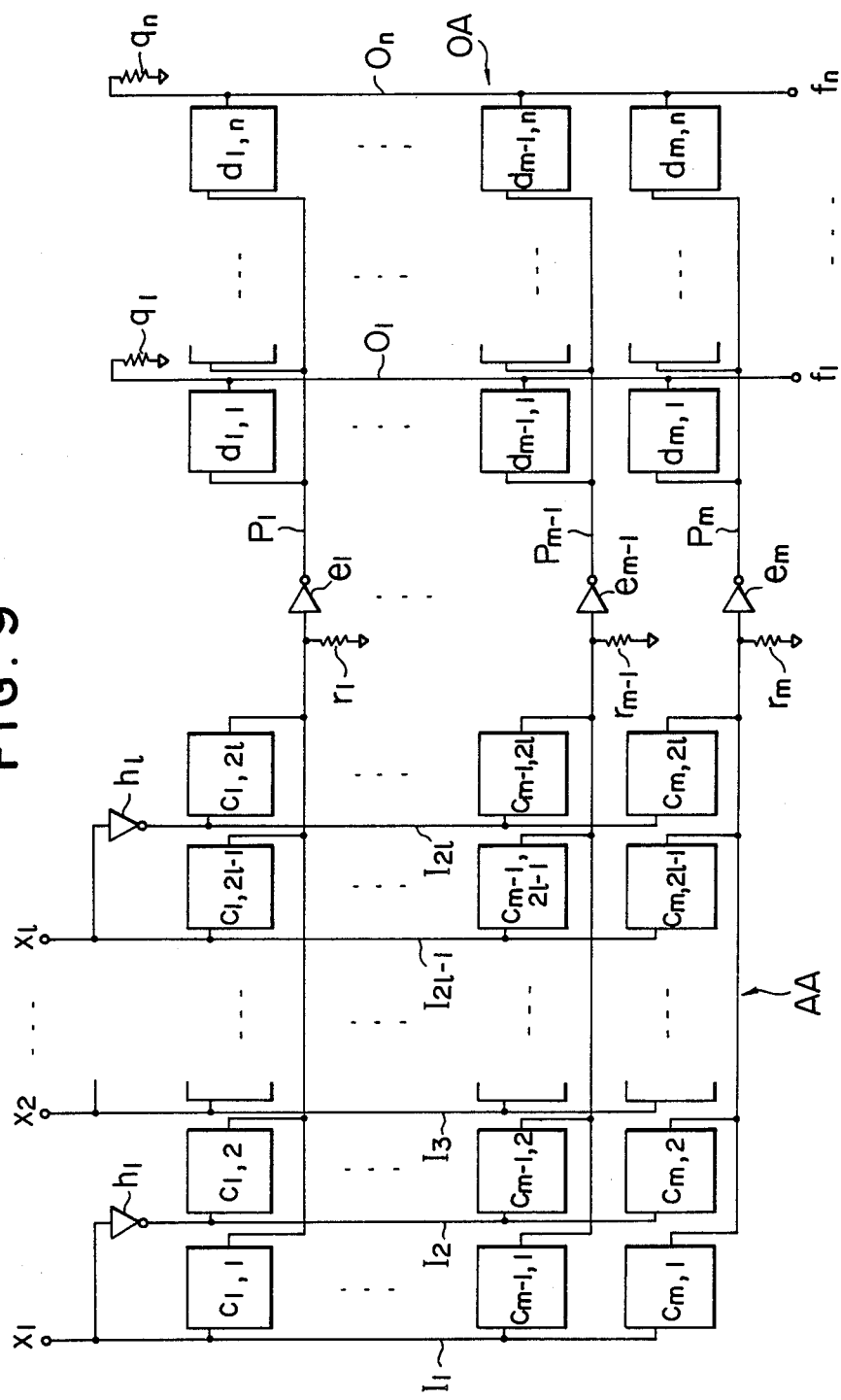
FIG. 9 is a circuit diagram showing an apparatus according to a sixth embodiment of the present invention.
Figure 10:
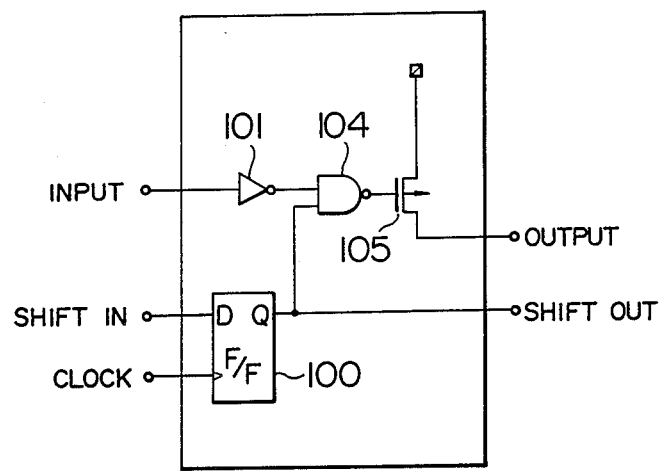
FIG. 10 is a circuit diagram showing a unit circuit used in the apparatus.

FIGS. 9 and 10 show an apparatus according to a sixth embodiment of the present invention. The apparatus comprises an AND array AA and an OR array OA in the same manner as the fifth embodiment, and can generate every desired logical function in the sum-of-products form. However, the apparatus according to the present embodiment comprises unit circuits $c_{1,1}, \ldots, c_{m,2l}, d_{1,1}, \ldots, d_{m,n}$ formed of PMOS FETs. The unit circuits $c_{1,1}, \ldots, c_{m,2l}$ are positioned at points where input lines $I_1, \ldots,$ and $I_{2l}$ and product term lines $P_1, \ldots, P_m$ intersect. The product term lines $P_1, \ldots, P_m$ are connected to the ground via resisters $r_1, \ldots, r_m$, and to inverters $e_1, \ldots, e_m$. An AND array AA comprises the input lines $I_1, \ldots, I_{2l}$, the unit circuits $c_{1,1}, \ldots, c_{m,2l}$, the product term lines $P_1, \ldots, P_m$, the resisters $r_1, \ldots, r_m$, and the inverters $e_1, \ldots, e_m$.

The unit circuits $d_{1,1}, \ldots, d_{m,n}$ are positioned at the points where the product term lines $P_1, \ldots, P_m$ and output lines $O_1, \ldots, O_n$ intersect. The output lines $O_1, \ldots, O_n$ are connected to the ground via resisters $q_1, \ldots, q_n$. An OR array OA is constituted by the product term lines $P_1, \ldots, P_m$, the output lines $O_1, \ldots, O_n$, the unit circuits $d_{1,1}, \ldots, d_{m,n}$, and the resisters $q_1, \ldots,$ and $q_n$.

Each of the unit circuits $c_{1,1}, \ldots, c_{m,2l}, d_{1,1}, \ldots, d_{m,n}$ comprises a flip-flop 100. An inverter 101, a NAND gate 104, and a PMOS FET 105. An input terminal of the unit circuit is connected to an input of the NAND gate 104 through the inverter 101. An output Q of the flip-flop 100 is connected to another input of the NAND gate 104. Output of the NAND gate 104 is connected to a gate of the PMOS FET 104. When the ouput Q of the flip-flop 100 is at logic 1, a signal line connected to the output terminal is sensitized. On the contrary, when the output Q is at logic 0, the signal line is desensitized.

Simple connections of the output terminals of the unit circuits $c_{1,1}, \ldots, c_{m,2l}$ to the respective product term lines $P_1, \ldots, P_m$ with resisters $r_1, r_m$ form wired-NAND connections. Simple connections of the output terminals of the unit circuits $d_{1,1}, \ldots, d_{m,n}$ to the respective output lines $O_1, \ldots, O_n$ with resisters $q_1, \ldots,$ and $q_n$ form wired-NAND connections.

When the flip-flop of the unit circuits $c_{1,1}, c_{1,3}$, and $c_{1,2l}$ store information indicating logic 1 and the flip-flops of the other unit circuits $c_{1,2}, c_{1,4}, \ldots, c_{1,2l-1}$ store information indicating logic 0, a signal $p_1$ on the product term line $P_1$ is as follows:

$$p_1 = \overline{\overline{x_1 \cdot x_2} \cdot \overline{x_1}} = x_1 \cdot x_2 \cdot \bar{x}_l$$

And, when the flip-flops of the unit circuits $d_{1,1}, d_{2,1},$ and $d_{m,1}$ store information indicating logic 1 and the flip-flops of the other unit circuits $d_{3,1}, \ldots, d_{m-1,1}$ store information indicating logic 0, an output function $f_1$ on the output line $O_1$ is as follows:

$$f_1 = \overline{\overline{p_1} \cdot \overline{p_2} \cdot \overline{p_m}} = \bar{p}_1 + \bar{p}_2 + \bar{p}_m$$

where $p_1, p_2, \ldots, p_m$ indicate signals on the product term lines $P_1, \ldots, P_m$.

As mentioned above, the apparatus according to the present embodiment can generate every desired logical function by changing information stored in the flip-flops of the unit circuits.

Figure 11:
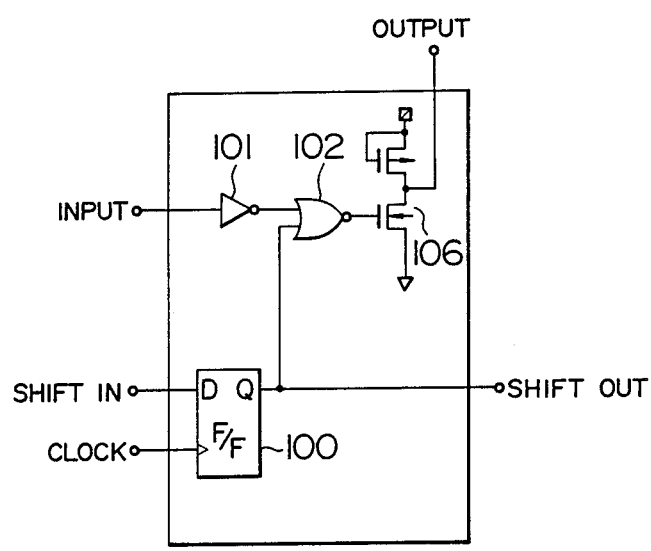
FIG. 11 is a circuit diagram showing an apparatus according to a seventh embodiment of the present invention.

FIG. 11 shows a unit circuit of an apparatus according to a seventh embodiment of the present invention. The unit circuit is formed of a CMOS circuit. The unit circuit comprises a flip-flop 100, an inverter 101, an NOR gate 102, and CMOS FETS 106. The apparatus is constituted as shown in FIG. 6.

While the output functions of the fifth, sixth, and seventh embodiments are in the sum-of-products form, the output function may alternately be in the product-of-sums form. The latter arrangement may be obtained mainly by exchange of the OR array and the AND array for each other.

Instead of the wired-NOR connections and the wired-NAND connections, logic gates, such as NOR gates, NAND gates, AND gates, OR gates, and inverters, may be used.

While the above-mentioned embodiments use a positive-logic, a negative logic may alternatively be used.

The apparatus according to the present invention may be formed by discrete elements such as gate ICs. It may be formed as an integrated circuit or a part of an integrated circuit.

The apparatus may be constituted by bipolar transistors, so that it can operate at a higher speed.

As mentioned above, the present invention makes it possible to perform a desired logical function. Since the apparatus of the present invention need not have fuses, it can be formed by ordinary manufacturing processes. Therefore, the apparatus can be formed as a part of an LSI, and can be highly integrated. Moreover, the apparatus of the present invention can operate more rapidly and their state can be changed more easily than those incorporating firm ware for the change of the logic function.

What is claimed is:

1. An apparatus for performing a desired logical function comprising:
   an AND array having
      input lines through which logical variables are inputted,
      one or more product term lines intersecting the input lines, and
      first unit circuits positioned at the respective points where the input lines and the product term lines intersect and connected to the input lines and the product term lines, each of the first unit circuits having
         a first storage means for storing information which determines whether the product term line connected to the first unit circuits is to be sensitized or desensitized and
         a first means for selectively sensitizing or desensitizing the product term line on the basis of the information stored in the first storage means,
   the AND array generating desired logical products of the logical variables on the respective product term lines; and
   an OR array having
      signal lines connected to the product term lines, respectively,
      one or more output lines intersecting the signal lines, and
      second unit circuits positioned at the respective points where the signal lines and the output lines intersect, each of the second unit circuits having
         a second storage means for storing information which determines whether the output line connected to the each of the second unit circuits is to be sensitized or desensitized and
         a second means for selectively sensitizing or desensitizing the output line on the basis of the information stored in the first storage means,
   the OR array generating a desired logical sum of the logical products on the respective output lines.

2. The apparatus according to claim 1, wherein at least a part of the first and second storage means are capable of rewriting.

3. The apparatus according to claim 1, wherein each of the first and second storage means comprises a shift register.

4. A method of determining logical function of a logic circuit having AND gates and at least one OR gate including signal lines, comprising the steps of:
   storing information in a storage means, said information determining whether each of the signal lines is to be sensitized or desensitized,
   connecting each of said AND gates in each of the signal lines by connecting said signal line to one input thereof and to an output thereof,
   connecting another input of each of the AND gates to a signal indicative of the stored information,
   connecting an input of said at least one OR gate to the output of each of the AND gates,
   selectively sensitizing or desensitizing the signal lines on the basis of the stored information, and
   supplying the output of the OR gate with a signal indicative of the logical function.

5. The method according to claim 4, wherein at least a part of the storage means are capable of rewriting.

6. The method according to claim 5, wherein each of the storage means comprises a shift register.

7. A method of determining logical function of a logic circuit having OR gates and at least one AND gate including signal lines, comprising the steps of:

storing information in the storage means, said information determining whether each of the signal lines is to be sensitized or desensitized, connecting each of said OR gates in each of the signal lines by connecting said signal line to one input thereof and to an output thereof, connecting another input of each of the OR gates to a signal indicative of the stored information, connecting an input of said at least one AND gate to the output of each of the OR gates, selectively sensitizing or desensitizing the signal lines on the basis of the stored information, and supplying the output of the AND gate with a signal indicative of the logical function.

8. The method according to claim 7, wherein at least a part of the storage means are capable of rewriting.

9. The method according to claim 8, wherein each of the storage means comprises a shift register.

10. An apparatus for performing a desired logical function, having a logic circuit including signal lines, comprising:

storage means for storing information which determines whether each of the signal lines is to be sensitized or desensitized, AND gates, each of which is connected in each of the signal lines through one input thereof and an output thereof and having another input thereof connected to receive a signal indicative of the stored information, and at least one OR gate having an input connected to the output of each of the AND gates, whereby the signal lines are selectively sensitized or desensitized and the output of the OR gate is supplied with a signal indicative of the desired logical function on the basis of the information stored in the storage means.

11. The apparatus according to claim 10, wherein at least a part of the storage means are capable of rewriting.

12. The apparatus according to claim 11, wherein each the storage means comprises a shift register.

13. An apparatus for performing a desired logical function, having a logic circuit including signal lines, comprising:

storage means for storing information which determines whether each of the signal lines is to be sensitized or desensitized, OR gates, each of which is connected in each of the signal lines through one input thereof and an output thereof and having another input thereof connected to receive a signal indicative of the stored information, and at least one AND gate having an input connected to the output of each of the OR gates, whereby the signal lines are selectively sensitized or desensitized and the output of the AND gate is supplied with a signal indicative of the desired logical function on the basis of the information stored in the storage means.

14. The apparatus according to claim 13, wherein at least a part of the storage means are capable of rewriting.

15. The apparatus according to claim 14, wherein each of the storage means comprises a shift register.

* * * * *